United States Patent [19]

Hubbard

[11] Patent Number: 5,227,659
[45] Date of Patent: Jul. 13, 1993

[54] INTEGRATED CIRCUIT INDUCTOR

[75] Inventor: Allyn E. Hubbard, Milton, Mass.

[73] Assignee: Trustees of Boston University, Boston, Mass.

[21] Appl. No.: 815,834

[22] Filed: Dec. 27, 1991

Related U.S. Application Data

[63] Continuation of Ser. No. 535,332, Jun. 8, 1990, abandoned.

[51] Int. Cl.$^5$ .............................................. H01L 27/02
[52] U.S. Cl. ................................... 257/531; 257/622; 257/635; 257/741; 257/773
[58] Field of Search ............... 357/51, 27; 257/422, 257/531, 622, 635, 741, 773

[56] References Cited

U.S. PATENT DOCUMENTS

| | | |
|---|---|---|
| 3,614,554 | 10/1971 | Richardson. |
| 3,671,793 | 6/1972 | Scarlett .................... 357/27 |
| 3,798,059 | 3/1974 | Astle et al. . |
| 3,988,764 | 10/1976 | Cline et al. . |

FOREIGN PATENT DOCUMENTS

| | | |
|---|---|---|
| 60-136156 | 9/1985 | Japan . |
| 1-123455 | 5/1989 | Japan ..................... 357/51 |
| 515171 | 6/1976 | U.S.S.R. . |

OTHER PUBLICATIONS

R. S. Popovi et al., "Magnetotransistor in CMOS Technology", *IEEE Transactions on Electric Devices*, vol. ED-33, (Sep. 1986), pp. 1334–1335.
S. M. Sze, *Semiconductor Devices Physics and Technology*, John Wiley & Sons, New York (1985) p. 341.
W. J. Taren, "Film-Semiconductor Storage System," *IBM Technical Disclosure Bulletin*, vol. 13 (Jun. 1970) p. 13.
Ferrey, D. K., ed., *Gallium Arsenide Technology*, Howard W. Sams & Co., Indianapolis, (1985), pp. 225–231, 263.
C. W. Wightman et al. "A data-parallel integrated signal detection architecture", Eighth Annual U/G/I Microelectronics Symposium, Jun. 12–14, 1989, LCN 79-87984.
"Magnetic thin film inductors for integrated circuit applications", *IEEE Transactions on Magnetics*, 15, (Nov. 1979) pp. 1803–1805 by R. F. Soohoo.
"A novel miniature planar inductor", *IEEE Transactions on Magnetics*, 23, (Sep. 1987), pp. 3759–3761, by O. Oshiro et al.

*Primary Examiner*—J. Carroll
*Attorney, Agent, or Firm*—Choate, Hall & Stewart

[57] ABSTRACT

An integrated circuit inductor is disclosed which can be fabricated by adding simple follow-on steps to standard fabrication line processes. In a preferred embodiment, standard CMOS technology is used to fabricate a multiturn coil having its axis normal to the layers of oxide, polysilicon, and metal which form the coil. For a coil 100 microns on a side, an inductance on the order of 10 nH can be achieved. By including a magnetic core in the design using the disclosed procedure, this value can be increased to as high as 0.1 mH. Thus, inductor values ranging from 0.001 mH–0.1 mH can be physically implemented as integrated, highly-miniaturized CMOS designs for analog operation in the range of approximately 1–100 MHz.

11 Claims, 6 Drawing Sheets

| ▨ THICK OXIDE | ▨ SUBSTRATE |
| ▨ METAL 2 | ▨ METAL 1 |
| ▨ POLYSILICON | ▨ OVERGLASS |
| ▨ MAGNETIC MATERIAL | |

| THICK OXIDE | SUBSTRATE |
| CONDUCTING LOOP | OVERGLASS |
| MAGNETIC MATERIAL | |

| THICK OXIDE | SUBSTRATE |
| CONDUCTING LOOP | OVERGLASS |
| MAGNETIC MATERIAL | |

INTEGRATED CIRCUIT INDUCTOR

This is a continuation of copending application Ser. No. 07/535,332 filed on Jun. 8, 1990 now abandoned.

BACKGROUND OF THE INVENTION

This invention relates to inductors for use in integrated circuitry, more particularly to inductor designs in which the coils are patterned during standard fabrication line processing and in which a magnetic core is deposited as a follow-on process.

Inductive components are critical to the design of many circuits. This is particularly true of many types of signal processing filters. This generally complicates the implementation of these designs as integrated circuits. While available to GaAs designers, inductors have rarely been used in silicon designs. In GaAs technology, the frequencies involved for analog designs using physical inductors are typically on the order of $10^{10}$ Hz. CMOS transistors will not function at these high frequencies. It is of great interest that designs in CMOS operate in the $10^5$–$10^8$ Hz range. Hence, CMOS inductors must be on the order of $10^2$–$10^5$ times larger than those used in GaAs. This implies the necessity of inductors in the range of 0.001–1.0 mH.

In silicon integrated circuit microchips which require inductive components, designers usually resort to simulating a passive inductance using an active filter configuration comprising capacitors and resistors, or else attach the inductive components external to the chip. Both approaches work against the miniaturization of the circuit, and severely limit performance and applications.

Some integrated inductors have been proposed, but they generally require exotic materials and new fabrication processes. For example, in U.S. Pat. No. 3,614,554, a thinfilm inductor design is disclosed in which an inductor coil with a magnetic core is formed in layers, the coil axis and core being parallel to the layers. This patterning of a magnetic core prevents the coils from being fabricated using standard CMOS processes.

SUMMARY OF THE INVENTION

The integrated circuit inductor of the present invention is fabricated using standard fabrication line processes and comprises a substrate over which alternating layers of conductor and insulator are deposited and patterned such that each conducting layer forms one loop, the loops being connected between insulating layers to form a coil having an axis normal to the layers.

The inductor design is appropriate for silicon process applications. In a preferred embodiment, the technology is CMOS, and the inductor coil is formed using standard fabrication line steps by appropriate patterning of oxide, diffused silicon, polysilicon, and metal over a substrate. When each conducting layer is patterned to form one loop of the coil, the result is a volcano-like core structure.

In the preferred embodiment, a ferromagnetic material is deposited in the core in a follow-on step to provide increased inductance. The resulting inductor, appropriately tailored, can provide inductance values in the range of nonoHenries to milliHenries.

DESCRIPTION OF THE PREFERRED EMBODIMENT

The coil of the inductor of the present invention is formed using standard fabrication-line CMOS or a related technology. The coil is formed in the direction of the normals of the layers comprising the microchip, by appropriate patterning of polysilicon, metal, and possibly diffusion layers. In one embodiment, a three-turn coil is formed using loops of polysilicon, metal1, and metal2, as illustrated in cross-section and top-view in FIG. 1. For clarity, the loops are shown as spiraling inward in the top-view. In an actual device, the loops would be approximately superimposed as shown in the cross-sectional view. The coil of FIG. 1 fabricated as 100 microns on a side provides an inductance of approximately 10 mH. This is comparable to or lager than the inductances available using GaAs technology, which are spirals or lines in a single layer, rather than multilayer co-linear loops (see, for example, Gallium Arsenide Technology, by D. K. Ferrey, ed., Howard W. Sams & Co., Inc., Indianapolis, 1985).

Figure 2:
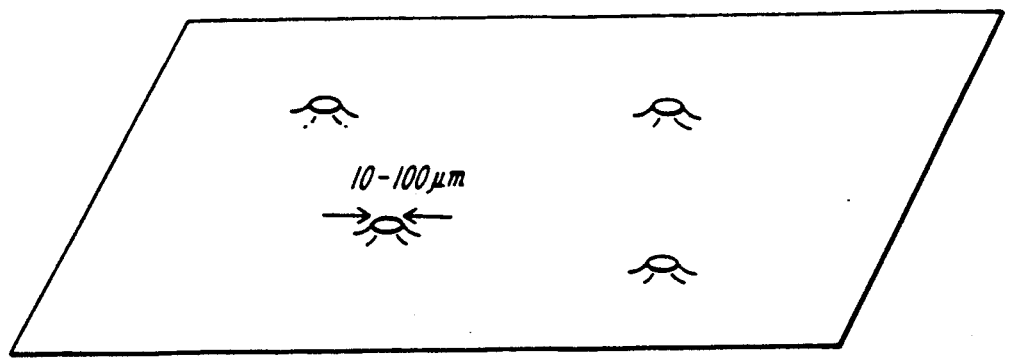
FIG. 2 shows the surface of a microchip fabricated according to the methods of the present invention showing the volcano-like structure of the inductors into which magnetic materials can be deposited.
Figure 3A:
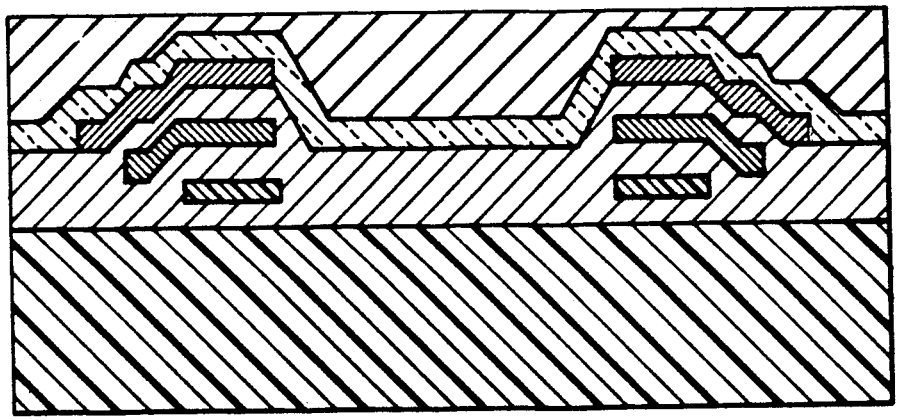
FIGS. 3a and 3b show cross-sections of the embodiment of FIG. 1 with the additional following step of coating the surface of the microchip with a magnetic material, which may then be removed except in the core of the inductor.
Figure 3B:
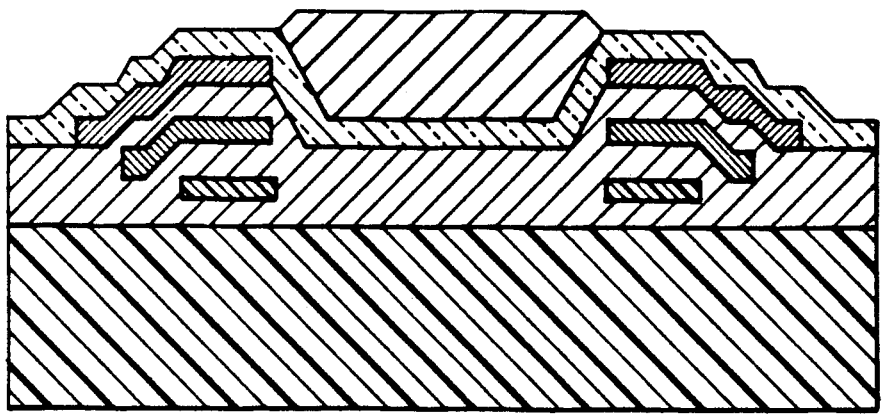

A well-known means of increasing the inductance of a coil is the insertion of a magnetic core. This increases the magnetic permeability by several orders of magnitude resulting in a greatly increased inductance. The key to the present invention is that, by using the method of overlaying conducting loops in several layers, a volcano-like structure results. The surface of a microchip including several inductors of the present invention is illustrated in FIG. 2. Application of magnetic material as a follow-on step, as illustrated in FIG. 3a, over the entire surface of the chip results in a deposit within the core of the inductor which is difficult or impossible to remove. Magnetic material from the rest of the surface may be chemically removed, as illustrated in FIG. 3b, or may be inconsequential for purposes of circuit function. Ideally, the insertion of a core is done as a final step of the fabrication process, but this is not essential. The magnetic core material can be added to the chip at a later time.

In one embodiment of the present invention, a ferromagnetic material such as an iron alloy on SiFe is used to form a core inside the coil. In another embodiment a magnetic ceramic composite is used. An iron/steel alloy would have a relative permeability of $10^4$. The increased permeability provided by such a core serves to increase the inductance of the coil of FIG. 1 to a value of the order of 1.0 mH. An alloy/ceramic composite would have a relative permeability of around $10^3$.

Figure 4:
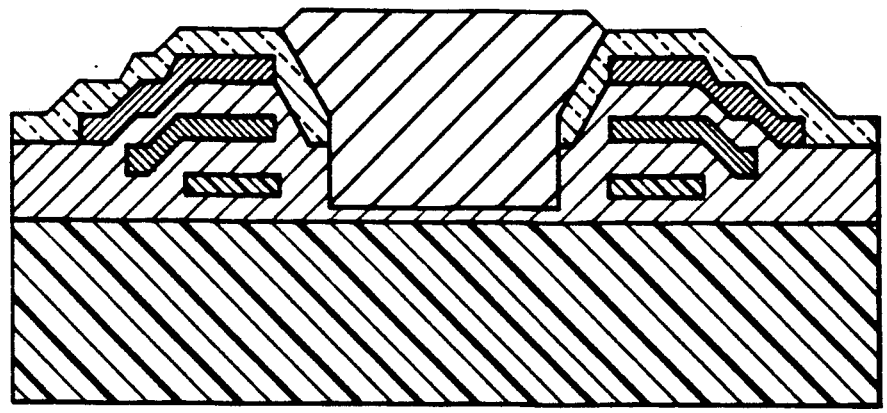
FIGS. 4a and 4b show cross-sections of the embodiment of FIGS. 3a and 3b with the addition of oxide cuts in the coil to allow the magnetic material to be deposited further inside the coil.
Figure 4A:
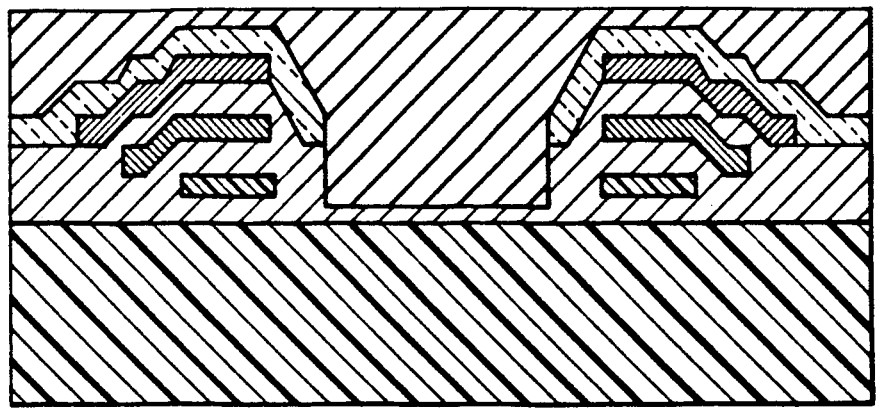
Figure 4B:
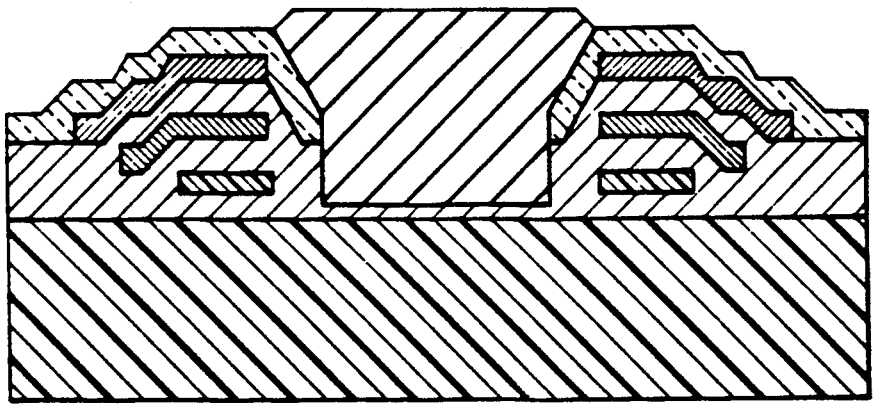
Figure 5A:
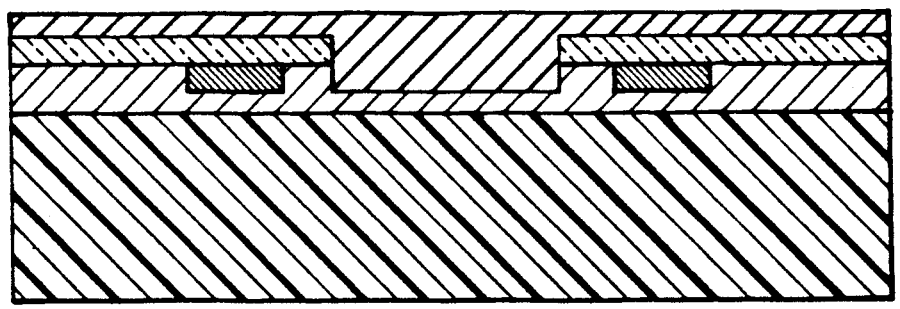
FIGS. 5a and 5b show cross-sections of another embodiment of the present invention having a coil of one turn.
Figure 5B:
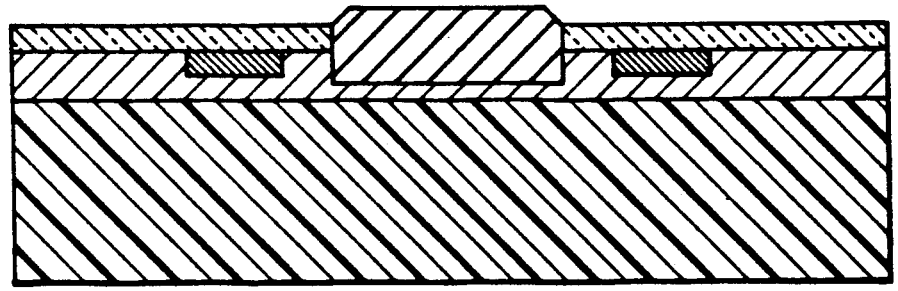

The inductance is due almost entirely to the turns around the magnetic core and is proportional to the square of the number of turns. Thus, there is a great incentive to increase the extent to which the magnetic core penetrates the coil. While existing CMOS fabrication processes nominally permit overglass cuts only to metal2, permitting such cuts over non-metal layers would allow the core material to extend further into the coil, as illustrated in FIG. 4 and FIG. 5. Small overglass cuts in violation of existing design rules are demonstrated in "A planar electrode array in standard CMOS technology," by A. E. Hubbard, the present inventor, and B. P. Houghton, in proceedings of the 8th Annual U/G/I/Microelectronics Symposium, Jun. 12–14, 1989.

Figure 1A:
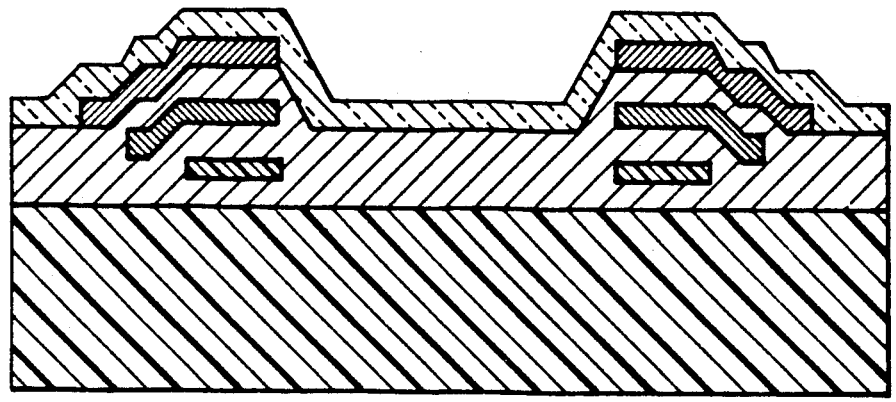
FIGS. 1a and 1b show a cross-section and top-view respectively of one embodiment of the inductor of the present invention which can be fabricated using standard CMOS processes.
Figure 1B:
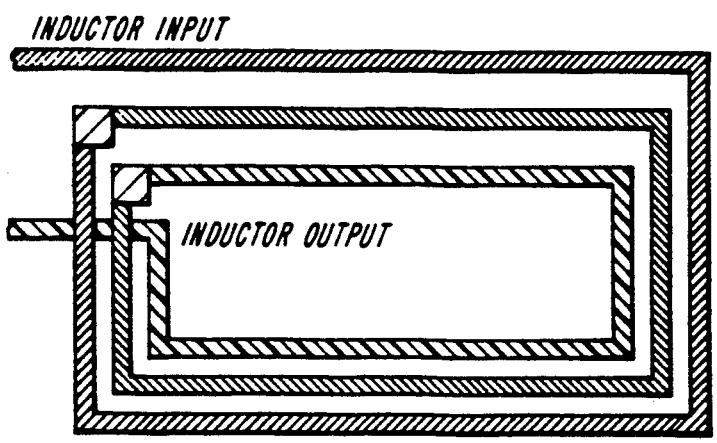
Figure 6A:
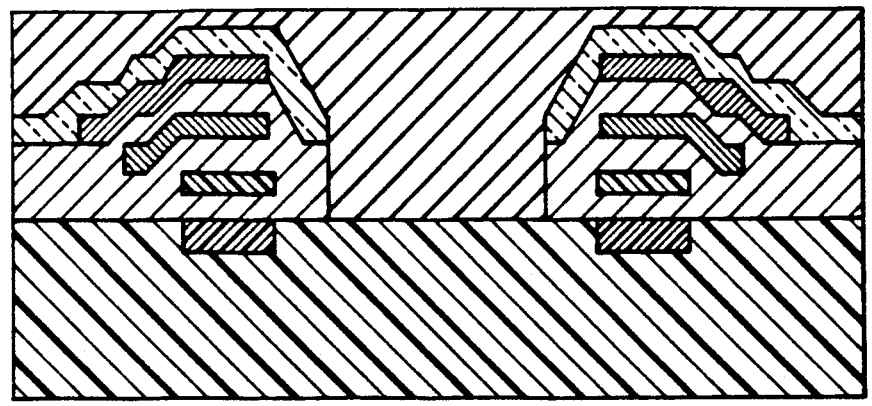
FIGS. 6a and 6b show cross-sections of yet another embodiment of the present invention wherein one turn of the coil is a loop of diffused silicon in the silicon substrate.
Figure 6B:
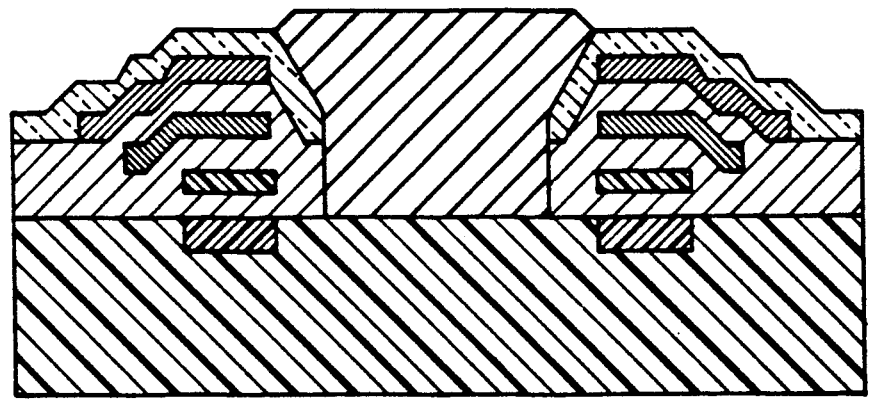

The inductance can be further increased by fabricating additional turns beyond the three shown in FIG. 1. Some standard CMOS processes allow additional polysilicon and/or metal layers. In addition, a loop of diffused silicon on the substrate could add an additional turn as illustrated in FIG. 6. In this way, inductance approaching 1.0 mH can be fabricated.

It will be clear to those skilled in the art that by changing the number and size of the loops and by changing the permeability of the magnetic core, the value of inductance can be varied to meet the requirements of a specific circuit. A single integrated circuit can thus include many inductors of different values. It is recognized that modifications and variations of the present invention will occur to those skilled in the art, and it is intended that all such modifications and variations will be included within the scope of the claims.

I claim:

1. An integrated circuit inductor comprising:
a substrate having a substantially planar surface,
a conducting loop with two ends deposited on said surface, the loop being in a plane substantially parallel to said substrate surface to form a coil having its axis substantially normal to the substrate surface,
an insulating layer over said conducting loop, and
magnetic material over said insulating layer such as magnetic material extends into said coil.

2. An integrated circuit inductor comprising:
a substrate having a substantially planar surface,
alternating conducting and insulating layers deposited on said surface, terminating with a final insulating layer, each conducting layer patterned to form one open conducting loop with two ends, the loop being in a plane substantially parallel to said substrate surface, and each insulating layer between two adjacent conducting loops including a conducting segment, the conducting segment connecting one end of each of the two loops to form a coil having its axis substantially normal to the substrate surface, and magnetic material over said final insulating layer such that magnetic material extends into said coil.

3. An integrated circuit inductor comprising:
a substrate having a substantially planar surface,
alternating conducting and insulating layers deposited on said surface, each conducting layer patterned to form one open conducting loop with two ends, the loop being in a plane substantially parallel to said substrate surface, and each insulating layer between two adjacent conducting loops including a conducting segment, the conducting segment connecting one end of each of the two loops to form a coil having its axis substantially normal to the substrate surface, wherein said substrate in silicon, each said insulating layer is silicon dioxide, and said coil comprises three conducting loops, wherein one of said conducting loops is polysilicon and two of said conducting loops are metal.

4. An integrated circuit inductor comprising:
a substrate having a substantially planar surface,
alternating conducting and insulting layers deposited on said surface, each conducting layer patterned to form one open conducting loop with two ends, the loop being in a plane substantially parallel to said substrate surface, and each insulating layer between two adjacent conducting loops including a conducting segment, the conducting segment connecting one end of each of the two loops to form a coil having its axis substantially normal to the substrate surface, wherein said substrate is silicon and further comprising an open conducting loop of diffused silicon in the silicon substrate, the loop having two ends and being in a plane substantially parallel to said substrate surface, one end of said loop connected by a conducting segment to said coil to form a loop of said coil.

5. The inductor of claim 1 wherein the conducting loop is a material selected from the group consisting of metal, polysilicon, and diffused silicon.

6. The inductor of claim 2 wherein said substrate is silicon, each said insulating layer is silicon dioxide, and said coil comprises three conducting loops, wherein one of said conducting loops is polysilicon and two of said conducting loops are metal.

7. The inductor of claim 2 wherein each conducting layer is a material selected from the group consisting of metal, polysilicon, and diffused silicon.

8. The inductor of claim 2 wherein each insulating layer is silicon dioxide.

9. The inductor of claims 2, 1 or 6 wherein said substrate is silicon and further comprising an open conducting loop of diffused silicon in the silicon substrate, the loop having two ends and being in a plane substantially parallel to said substrate surface, one end of said loop connected by a conducting segment to said coil to form a loop of said coil.

10. The inductor of claims 2, 1 or 6 wherein said magnetic material is a ferromagnetic material.

11. The inductor of claims 2, 1 or 6 wherein said magnetic material is a ceramic composite.

* * * * *

UNITED STATES PATENT AND TRADEMARK OFFICE
CERTIFICATE OF CORRECTION

PATENT NO. : 5,227,659
DATED : Jul. 13, 1993
INVENTOR(S) : Allyn E. Hubbard

It is certified that error appears in the above-indentified patent and that said Letters Patent is hereby corrected as shown below:

Column 1, line 6: please insert the following phrase: "The government has rights in this invention pursuant to NIH Grant No. 2S07RR07043-25.";

Column 1, line 64: please delete "nonoHenries" and insert therefor -- nanoHenries --;

Column 2, line 8: please delete "following" and insert therefor -- follow-on --;

Column 2, line 39: please delete "mH" and insert therefor -- nH --;

Column 2, line 39: please delete "lager" and insert therefor -- larger --;

Col. 2, line 65, delete "on" and insert --or--.

Column 3, line 3: please delete "of the" and insert therefor -- on the --; and

Signed and Sealed this

Eighteenth Day of October, 1994

Attest:

BRUCE LEHMAN

*Attesting Officer*      *Commissioner of Patents and Trademarks*